US008404410B2

(12) United States Patent
Murakami et al.

(10) Patent No.: US 8,404,410 B2
(45) Date of Patent: Mar. 26, 2013

(54) METHOD OF ALIGNING PHOTOMASK WITH BASE MATERIAL AND METHOD OF MANUFACTURING PRINTED CIRCUIT BOARD

(75) Inventors: Kousuke Murakami, Ibaraki (JP); Akira Arima, Ibaraki (JP); Tomohiro Hattori, Ibaraki (JP); Shuuhei Miyazaki, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 175 days.

(21) Appl. No.: 13/085,269

(22) Filed: Apr. 12, 2011

(65) Prior Publication Data

US 2011/0262869 A1 Oct. 27, 2011

(30) Foreign Application Priority Data

Apr. 22, 2010 (JP) .................................. 2010-098492

(51) Int. Cl.
*G03F 9/00* (2006.01)

(52) U.S. Cl. .............................. 430/22; 430/30; 430/311

(58) Field of Classification Search .................... 430/22, 430/30, 311
See application file for complete search history.

(56) References Cited

U.S. PATENT DOCUMENTS 5,198,857 A  3/1993  Goto

FOREIGN PATENT DOCUMENTS

| JP | 03289662 A | 12/1991 |
|----|------------|---------|
| JP | 05217843 A | 8/1993  |
| JP | 05323621 A | 12/1993 |

*Primary Examiner* — Christopher Young
(74) *Attorney, Agent, or Firm* — Panitch Schwarze Belisario & Nadel LLP

(57) ABSTRACT

An exposure system includes an exposure device and an image processing device. The exposure device includes a plurality of cameras. Each of the cameras is configured so as to be selectively set to a full scan mode and a partial scan mode. The camera transmits all of obtained image data in the full scan mode, and extracts part of the obtained image data and transmits the partial image data in the partial scan mode. The image processing device paratactically performs processing using the image data transmitted from the camera and processing using the image data transmitted from the camera.

5 Claims, 19 Drawing Sheets

FIG. 6
(a) 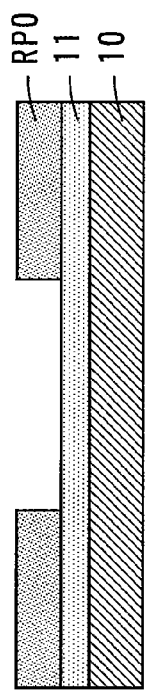
(b) 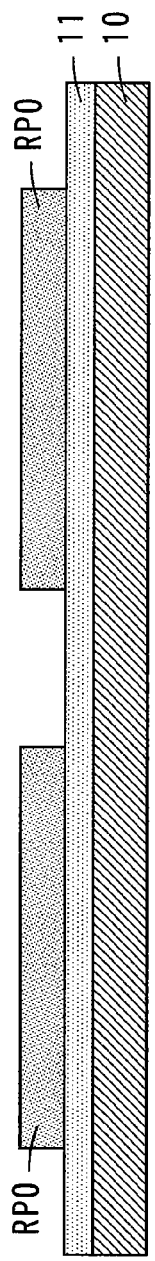

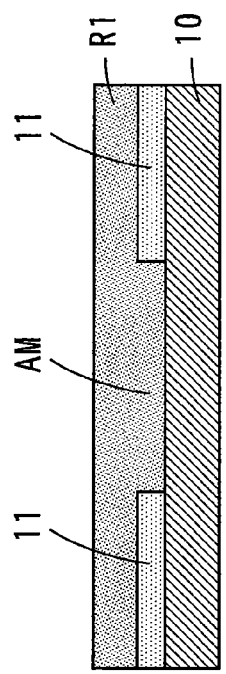
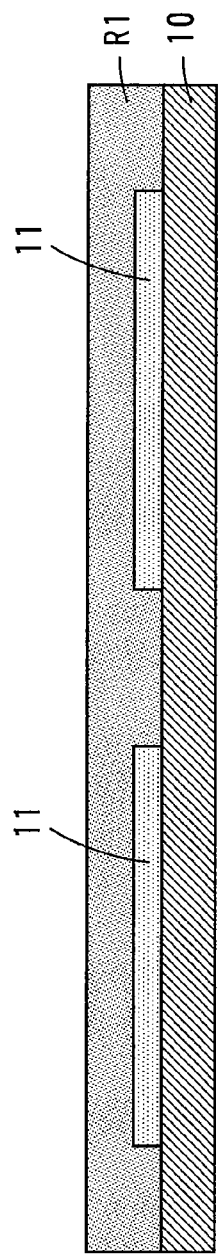
FIG. 8

FIG. 9
(a) 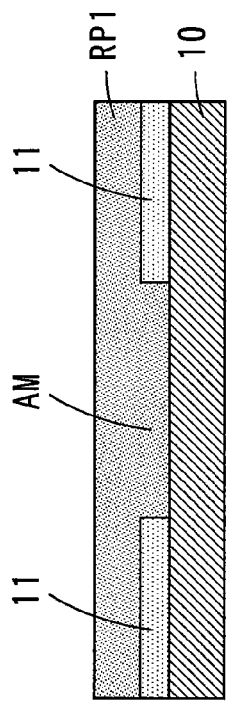
(b) 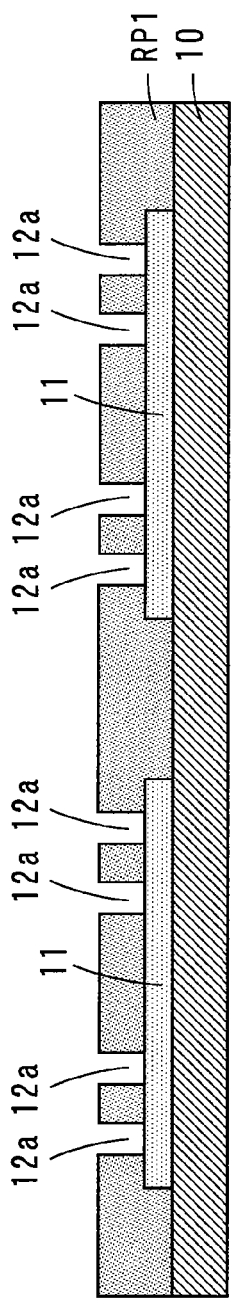

F I G. 11
(a) 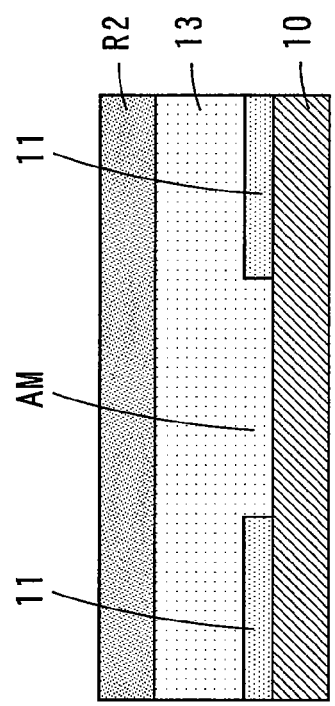
(b) 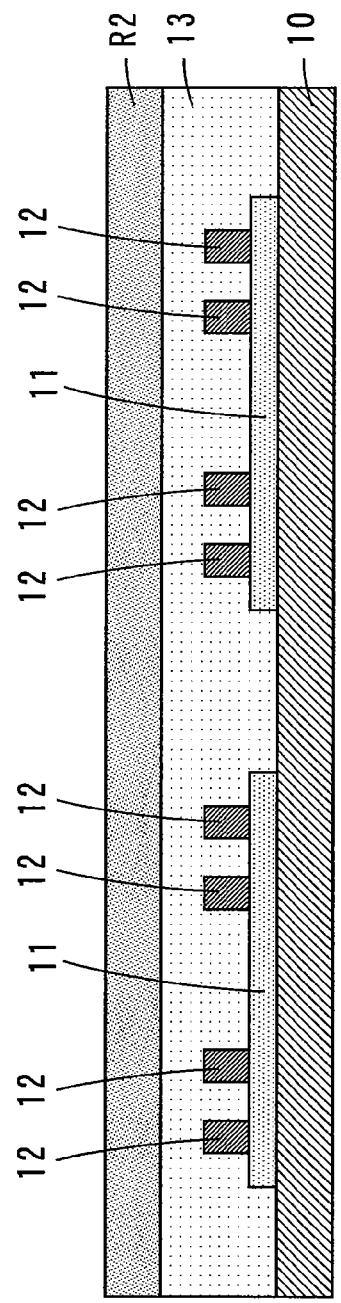

FIG. 12
(a) 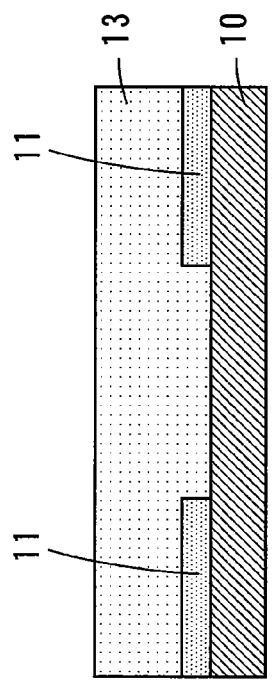
(b) 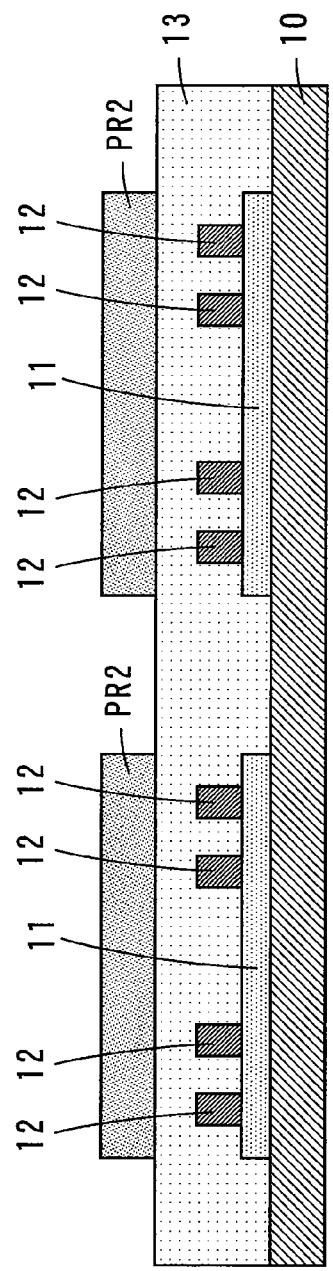

FIG. 19
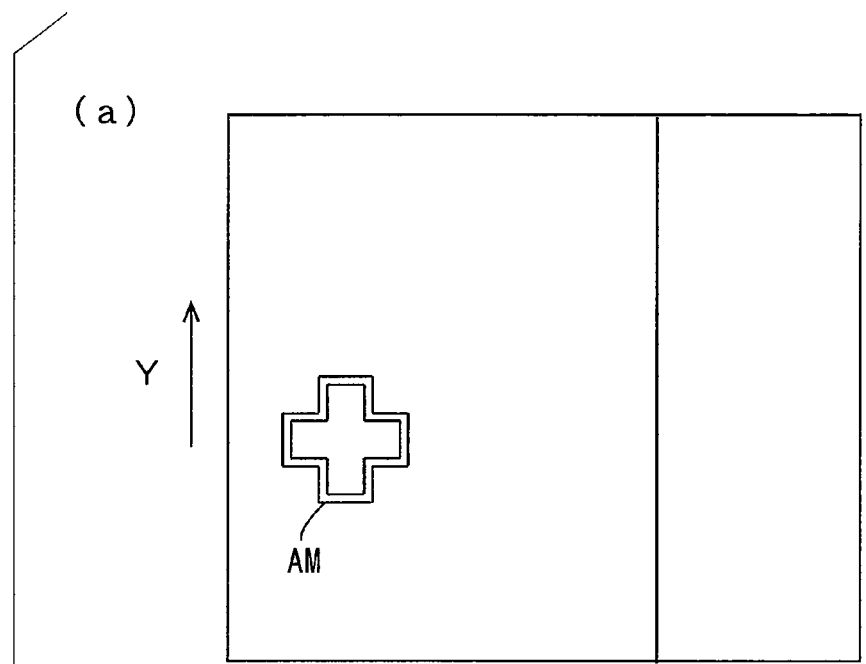
(a)
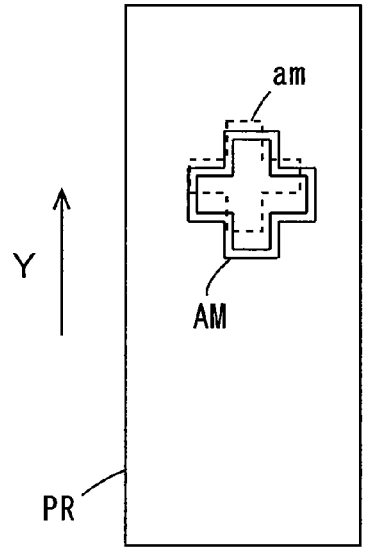
(b)

METHOD OF ALIGNING PHOTOMASK WITH BASE MATERIAL AND METHOD OF MANUFACTURING PRINTED CIRCUIT BOARD

BACKGROUND OF THE INVENTION

1. Field of the Invention

The present invention relates to a method of aligning a photomask with a base material in manufacturing steps of a printed circuit board, and a method of manufacturing the printed circuit board.

2. Description of the Background Art

In a printed circuit board, a conductor layer having a given pattern is formed on an insulating layer. Application of a photoresist (hereinafter abbreviated as a resist), exposure processing and development processing for forming the conductor layer in a given pattern, for example, are performed in manufacturing steps of the printed circuit board. The resist is applied on the conductor layer, thereby forming a resist layer on the conductor layer, for example. In the exposure processing, a surface of the resist layer is irradiated with light through a photomask. Thus, the resist layer is exposed in a pattern of the photomask. The development processing is then performed, so that the resist layer having the given pattern (hereinafter referred to as a resist pattern) is formed on the conductor layer.

In this state, a region of the conductor layer excluding a region below the resist pattern is removed by etching, for example, and the resist pattern is subsequently removed. In this manner, the conductor layer is formed in the given pattern.

During the foregoing exposure processing, it is necessary to detect a region to be exposed (hereinafter referred to as an exposure region) of the resist layer on a base material such as the conductor layer, and align the exposure region and the photomask with each other. For aligning the base material, an alignment mark for exposure is provided in the base material, and the base material is moved such that the alignment mark is positioned in a given position. When the base material is aligned, the base material is photographed by a camera, and an image including the alignment mark is processed, so that a position of the alignment mark is detected (see JP 5-217843 A, for example).

In recent years, reduction in time for the exposure processing has been required in order to improve manufacture efficiency of the printed circuit board. Therefore, the exposure region and the photomask need to be efficiently aligned with each other.

BRIEF SUMMARY OF THE INVENTION

An object of the present invention is to provide a method of aligning a photomask with a base material capable of reducing time for aligning the photomask with the base material, and a method of manufacturing the printed circuit board using the same.

(1) According to an aspect of the present invention, a method of aligning a photomask with a base material when exposure processing is performed on the base material, wherein the photomask has a plurality of first alignment marks, and the base material has a plurality of second alignment marks corresponding to the plurality of first alignment marks, and the method includes the steps of acquiring a plurality of first images including the plurality of first alignment marks, respectively, by a plurality of imaging devices, transmitting a plurality of first image data representing the plurality of first images, respectively, from the plurality of imaging devices to a data processing device, detecting positions of the first alignment marks by the data processing device based on the plurality of first image data and setting respective partial regions including the first alignment marks in imaging ranges of the plurality of imaging devices, acquiring a plurality of second images including the plurality of second alignment marks, respectively, by the plurality of imaging devices, transmitting a plurality of second image data representing the plurality of second images, respectively, from the plurality of imaging devices to the data processing device, calculating respective positional relationships between the plurality of first alignment marks and the plurality of second alignment marks by paratactic data processing of the data processing device based on the plurality of second image data, moving the base material relative to the photomask based on the positional relationships calculated by the data processing device such that the positions of the plurality of first alignment marks coincide with positions of the plurality of second alignment marks, respectively, acquiring a plurality of third images including the plurality of second alignment marks, respectively, by the plurality of imaging devices after the base material is moved relative to the photomask, transmitting respective image data of the set partial regions in the plurality of third images as a plurality of third image data from the plurality of imaging devices to the data processing device, calculating the respective positional relationships between the plurality of first alignment marks and the plurality of second alignment marks by the paratactic data processing of the data processing device based on the plurality of third image data, and determining whether or not the positions of the plurality of first alignment marks coincide with the positions of the plurality of second alignment marks, respectively, based on the positional relationships obtained by the data processing device.

In the aligning method, first, the plurality of first images including the plurality of first alignment marks, respectively, are acquired by the plurality of imaging devices. Next, the plurality of first image data representing the plurality of first images are transmitted from the plurality of imaging devices to the data processing device. In the data processing device, the positions of the first alignment marks are detected based on the plurality of first image data, and the partial region including the first alignment mark is set in the imaging range of each of the plurality of imaging devices.

The plurality of second images including the plurality of second alignment marks, respectively, are acquired by the plurality of imaging devices. Next, the plurality of second image data representing the plurality of second images, respectively, are transmitted from the plurality of imaging devices to the data processing device.

In the data processing device, the respective positional relationships between the plurality of first alignment marks and the plurality of second alignment marks are calculated by the paratactic data processing based on the plurality of second image data. In this case, the plurality of positional relationships are obtained almost simultaneously.

After that, the base material is moved relative to the photomask based on the positional relationships calculated by the data processing device such that the positions of the plurality of first alignment marks coincide with the positions of the plurality of second alignment marks, respectively.

After the base material is moved relative to the photomask, the third images including the plurality of second alignment marks, respectively, are acquired by the plurality of imaging devices. In this case, the second alignment mark exists at the same position as or a close position to the corresponding first alignment mark in the image obtained by each imaging device. Accordingly, each second alignment mark is included in the partial region that is preset in the third image.

The image data of each of the set partial regions in the plurality of third images is transmitted as the third image data from each of the plurality of imaging devices to the data processing device. In this case, the amount of the third image data is smaller than the amount of the second image data. Thus, the plurality of third image data are transmitted from the plurality of imaging devices to the data processing device in a short time.

In the data processing device, the respective positional relationships between the plurality of first alignment marks and the plurality of second alignment marks are calculated by the paratactic data processing based on the plurality of third image data. In this case, since the amount of the third image data is smaller than the amount of the second image data, the plurality of positional relationships are calculated almost simultaneously in a shorter time.

After that, determination as to whether or not the positions of the plurality of first alignment marks coincide with the positions of the plurality of second alignment marks, respectively, is made based on the positional relationships obtained by the data processing device.

When the positions of the plurality of first alignment marks coincide with the positions of the plurality of second alignment marks, respectively, exposure processing can be performed on the base material using the photomask. Meanwhile, when the positions of the plurality of first alignment marks are shifted from the positions of the plurality of second alignment marks, the photomask and the base material can be accurately aligned with each other such that the positions of the plurality of first alignment marks coincide with the positions of the plurality of second alignment marks, respectively, by acquiring the third images using the plurality of imaging devices, transmitting the image data of the partial regions in the third images, calculating the positional relationships between the plurality of first alignment marks and the plurality of second alignment marks, and moving the base material relative to the photomask in a repetitive manner.

In this manner, the positional relationships between the plurality of first alignment marks and the plurality of second alignment marks can be obtained in a shorter time by the paratactic data processing based on the plurality of first and second image data. The third image data representing the partial regions in the plurality of images are transmitted from the plurality of imaging devices to the data processing device, thereby reducing a transmission time of the image data. Furthermore, the positional relationships between the plurality of first alignment marks and the plurality of second alignment marks can be obtained by the paratactic data processing based on the plurality of third image data representing the partial regions in the plurality of images with higher accuracy in a shorter time. Accordingly, the photomask and the base material can be accurately aligned with each other using the plurality of first and second alignment marks in a shorter time.

Note that acquiring the plurality of first images including the plurality of first alignment marks, respectively, by the plurality of imaging devices and acquiring the plurality of second images including the plurality of second alignment marks, respectively, by the plurality of imaging devices may be performed in the common step. In this case, a plurality of common images including both the plurality of first alignment marks and the plurality of second alignment marks, respectively, are acquired as the plurality of first or second images.

(2) Accuracy of the calculation of the positional relationships based on the plurality of third image data may be higher than accuracy of the calculation of the positional relationships based on the plurality of second image data.

In this case, since the amount of the plurality of third image data is smaller than the amount of the plurality of second image data, an increase in a calculation time is suppressed even when the positional relationships between the plurality of first alignment marks and the plurality of second alignment marks are calculated with higher accuracy.

(3) The paratactic data processing may be multithread processing. In this case, the positional relationships between the plurality of first alignment marks and the plurality of second alignment marks are calculated at higher speed.

(4) According to another aspect of the present invention, a method of manufacturing a printed circuit board including exposure processing for forming a pattern of any layer of a base material including a plurality of layers includes the steps of forming a plurality of second alignment marks, which correspond to a plurality of first alignment marks formed in a photomask in an exposure device, in the base material, and performing the exposure processing on the any layer of the base material, wherein the step of performing the exposure processing includes the steps of acquiring a plurality of first images including the plurality of first alignment marks, respectively, by a plurality of imaging devices, transmitting a plurality of first image data representing the plurality of first images, respectively, from the plurality of imaging devices to a data processing device, detecting positions of the first alignment marks by the data processing device based on the plurality of first image data and setting respective partial regions including the first alignment marks in imaging ranges of the plurality of imaging devices, acquiring a plurality of second images including the plurality of second alignment marks, respectively, by the plurality of imaging devices, transmitting a plurality of second image data representing the plurality of second images, respectively, from the plurality of imaging devices to the data processing device, calculating respective positional relationships between the plurality of first alignment marks and the plurality of second alignment marks by paratactic data processing of the data processing device based on the plurality of second image data, moving the base material relative to the photomask based on the positional relationships calculated by the data processing device such that the positions of the plurality of first alignment marks coincide with positions of the plurality of second alignment marks, respectively, acquiring a plurality of third images including the plurality of second alignment marks, respectively, by the plurality of imaging devices after the base material is moved relative to the photomask, transmitting respective image data of the set partial regions in the plurality of third images as a plurality of third image data from the plurality of imaging devices to the data processing device, calculating the respective positional relationships between the plurality of first alignment marks and the plurality of second alignment marks by the paratactic data processing of the data processing device based on the plurality of third image data, determining whether or not the positions of the plurality of first alignment marks coincide with the positions of the plurality of second alignment marks, respectively, based on the positional relationships obtained by the data processing device, and performing exposure on the base material by the exposure device using the photomask when the positions of the plurality of first alignment marks coincide with the positions of the plurality of second alignment marks, respectively.

In the method of manufacturing the printed circuit board, the plurality of second alignment marks, which correspond to the plurality of first alignment marks formed in the photomask in the exposure device, are formed in the base material.

In the exposure processing on the any layer of the base material, first, the plurality of first images including the plurality of first alignment marks, respectively, are acquired by the plurality of imaging devices. Next, the plurality of first image data representing the plurality of first images are transmitted from the plurality of imaging devices to the data processing device. In the data processing device, the positions of the first alignment marks are detected based on the plurality of first image data, and the partial region including the first alignment mark is set in the imaging range of each of the plurality of imaging devices.

The plurality of second images including the plurality of second alignment marks, respectively, are acquired by the plurality of imaging devices. Next, the plurality of second image data representing the plurality of second images, respectively, are transmitted from the plurality of imaging devices to the data processing device.

In the data processing device, the respective positional relationships between the plurality of first alignment marks and the plurality of second alignment marks are calculated by the paratactic data processing based on the plurality of second image data. In this case, the plurality of positional relationships are obtained almost simultaneously.

After that, the base material is moved relative to the photomask based on the positional relationships calculated by the data processing device such that the positions of the plurality of first alignment marks coincide with the positions of the plurality of second alignment marks, respectively.

After the base material is moved relative to the photomask, the third images including the plurality of second alignment marks, respectively, are acquired by the plurality of imaging devices. In this case, the second alignment mark exists at the same position as or a close position to the corresponding first alignment mark in the image obtained by each imaging device. Accordingly, each second alignment mark is included in the partial region that is preset in the third image.

The image data of each of the set partial regions in the plurality of third images is transmitted as the third image data from each of the plurality of imaging devices to the data processing device. In this case, the amount of the third image data is smaller than the amount of the second image data. Thus, the plurality of third image data are transmitted from the plurality of imaging devices to the data processing device in a shorter time.

In the data processing device, the respective positional relationships between the plurality of first alignment marks and the plurality of second alignment marks are calculated by the paratactic data processing based on the plurality of third image data. In this case, since the amount of the third image data is smaller than the amount of the second image data, the plurality of positional relationships are calculated almost simultaneously in a shorter time.

After that, determination as to whether or not the positions of the plurality of first alignment marks coincide with the positions of the plurality of second alignment marks, respectively, is made based on the positional relationships obtained by the data processing device.

When the positions of the plurality of first alignment marks coincide with the positions of the plurality of second alignment marks, respectively, exposure processing can be performed on the base material using the photomask. Meanwhile, when the positions of the plurality of first alignment marks are shifted from the positions of the plurality of second alignment marks, the photomask and the base material can be accurately aligned with each other such that the positions of the plurality of first alignment marks coincide with the positions of the plurality of second alignment marks, respectively, by acquiring the third images using the plurality of imaging devices, transmitting the image data of the partial regions in the third images, calculating the positional relationships between the plurality of first alignment marks and the plurality of second alignment marks, and moving the base material relative to the photomask in a repetitive manner.

In this manner, the positional relationships between the plurality of first alignment marks and the plurality of second alignment marks can be obtained in a shorter time by the paratactic data processing based on the plurality of first and second image data. The third image data representing the partial regions in the plurality of images are transmitted from the plurality of imaging devices to the data processing device, thereby reducing a transmission time of the image data. Furthermore, the positional relationships between the plurality of first alignment marks and the plurality of second alignment marks can be obtained by the paratactic data processing based on the plurality of third image data representing the partial regions in the plurality of images with higher accuracy in a shorter time. Accordingly, the photomask and the base material can be accurately aligned with each other using the plurality of first and second alignment marks in a shorter time. As a result, a manufacture time of the printed circuit board is shortened.

(5) The printed circuit board may include a first insulating layer, a conductor layer and a second insulating layer in this order, and the base material may include at least a photosensitive resist layer, and the exposure processing may be performed on the photosensitive resist layer for forming a pattern of at least one of the first insulating layer, the conductor layer and the second insulating layer.

In this case, the pattern of the at least one of the first insulating layer, the conductor layer and the second insulating layer is formed in a shorter time. Thus, the manufacture time of the printed circuit board is shortened.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWINGS

FIGS. 6 (a), (b) are sectional views illustrating a step in the one example of the method of manufacturing the suspension board according to the present embodiment;

FIGS. 8 (a), (b) are sectional views illustrating a step in the one example of the method of manufacturing the suspension board according to the present embodiment;

FIGS. 9 (a), (b) are sectional views illustrating a step in the one example of the method of manufacturing the suspension board according to the present embodiment;

FIGS. 11 (a), (b) are sectional views illustrating a step in the one example of the method of manufacturing the suspension board according to the present embodiment;

FIGS. 12 (a), (b) are sectional views illustrating a step in the one example of the method of manufacturing the suspension board according to the present embodiment;

FIGS. 19 (a), (b) are diagrams showing examples of images obtained by the cameras.

DETAILED DESCRIPTION OF THE INVENTION

Figure 1:
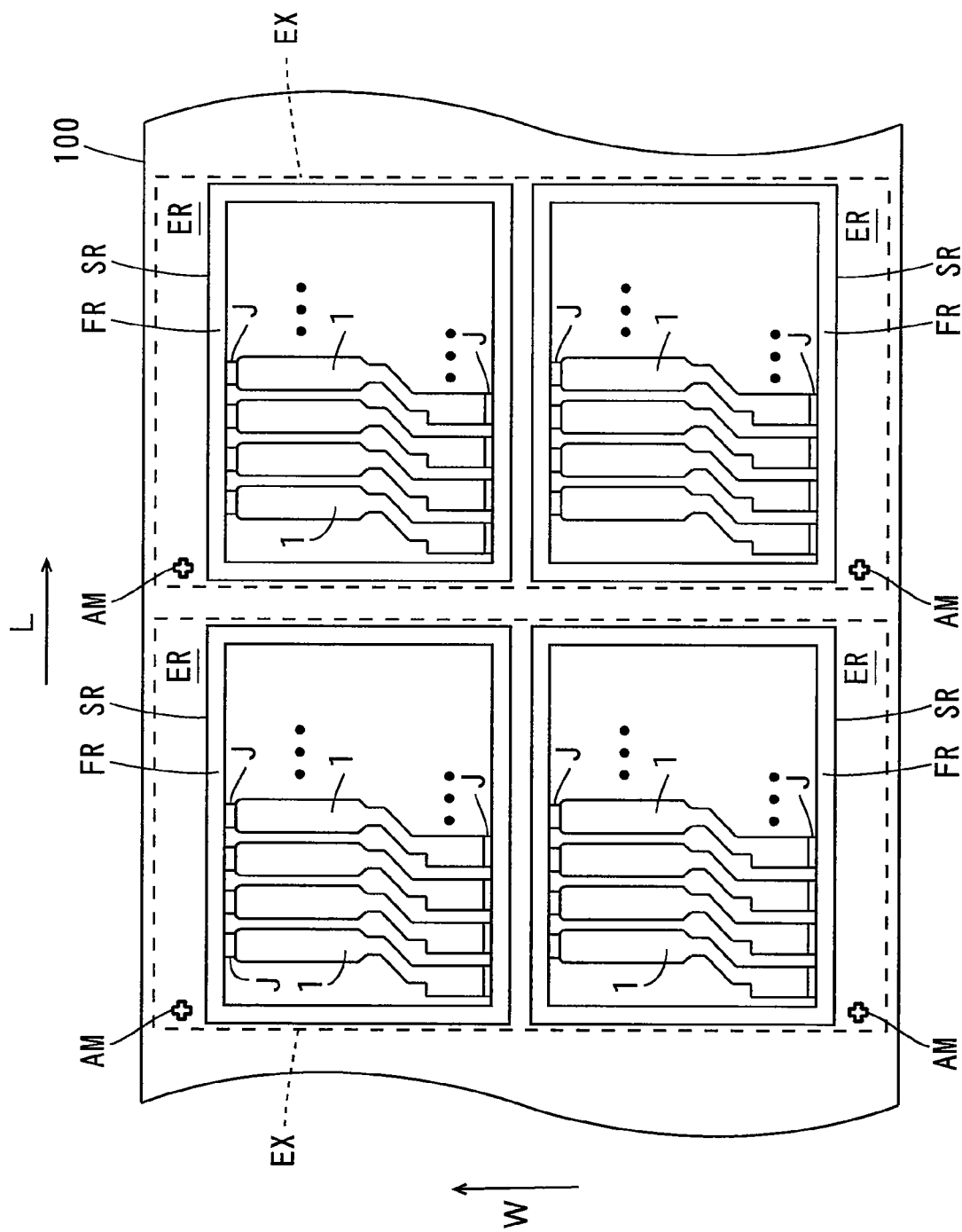
FIG. 1 is a top view of a suspension board assembly sheet according to the present embodiment.

Description will be made of a method of manufacturing a printed circuit board according to one embodiment of the present invention while referring to the drawings. In the present embodiment, a suspension board with circuits (hereinafter referred to as a suspension board) is described as one example of the printed circuit board.

(1) Assembly Sheet

Figure 2:
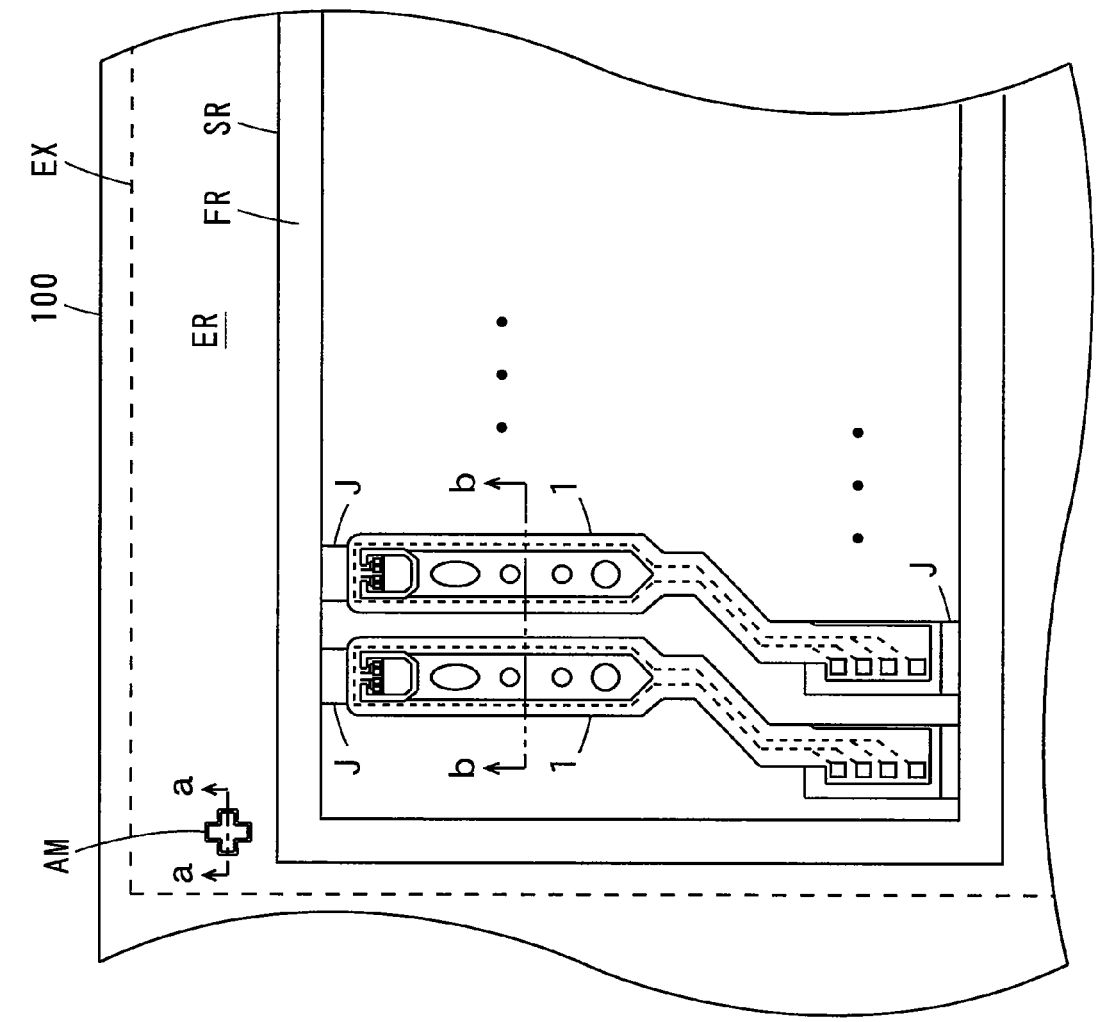
FIG. 2 is a partially enlarged view of the assembly sheet of FIG. 1.

FIG. 1 is a top view of a suspension board assembly sheet (hereinafter referred to as an assembly sheet) according to the present embodiment. FIG. 2 is a partially enlarged view of the assembly sheet of FIG. 1. The assembly sheet refers to a half-finished product in a manufacture process of the suspension board.

In manufacture of the assembly sheet 100 of FIG. 1, a plurality of layers each having a given pattern are formed on a long-sized base material while the long-sized base material is transported in its longitudinal direction by a roll-to-roll system. A resist layer is formed, and then subjected to exposure processing, development processing, plating processing, etching and so on, so that the pattern is formed in each of the layers. Details of manufacturing steps of the suspension board will be described below.

In FIG. 1, the long-sized assembly sheet 100 is transported in the longitudinal direction L. A plurality of quadrangular substrate formation regions SR are formed in two rows along the longitudinal direction L in the assembly sheet 100. Each of the substrate formation regions SR has a frame FR. A plurality of long-sized suspension boards 1 are formed inside the frame FR. Both ends of each suspension board 1 are coupled to the frame FR through coupling portions J (see FIG. 2). The coupling portions J are cut in the final stage of the manufacturing steps, so that each suspension board 1 is separated from the frame FR.

The above-mentioned exposure processing of the resist layer is performed for each exposure region EX surrounded by the dotted line. The exposure region EX corresponds to a pattern formation region of a photomask used in the exposure processing. Each exposure region EX includes two substrate formation regions SR arranged in a width direction W of the assembly sheet 100, and includes side regions ER arranged between both lateral sides of the assembly sheet 100 and the substrate formation regions SR. The number of the substrate formation regions SR included in each exposure region EX is not limited to two. Each exposure region EX may include one substrate formation region SR, or may include three or more substrate formation regions SR.

An alignment mark AM is formed in each of the side regions ER on outer sides of the substrate formation regions SR. The alignment mark AM is used for aligning the photomask with the exposure region EX during the exposure processing.

Here, description is made of an example in which first, second and third photomasks are used for forming patterns of three kinds of layers. Alignment marks corresponding to the alignment mark AM of the assembly sheet 100 are formed in the first, second and third photomasks. In an exposure device, the exposure region EX is aligned with the first, second and third photomasks using the plurality of alignment marks AM of the assembly sheet 100 and the plurality of alignment marks of the first, second and third photomasks. This allows the exposure region EX to be accurately aligned with the first, second and third photomasks. In the present embodiment, the alignment mark AM has a cross shape. A method of aligning the exposure region EX with the first, second and third photomasks will be described below.

(2) The Configuration of the Suspension Board

Figure 3:
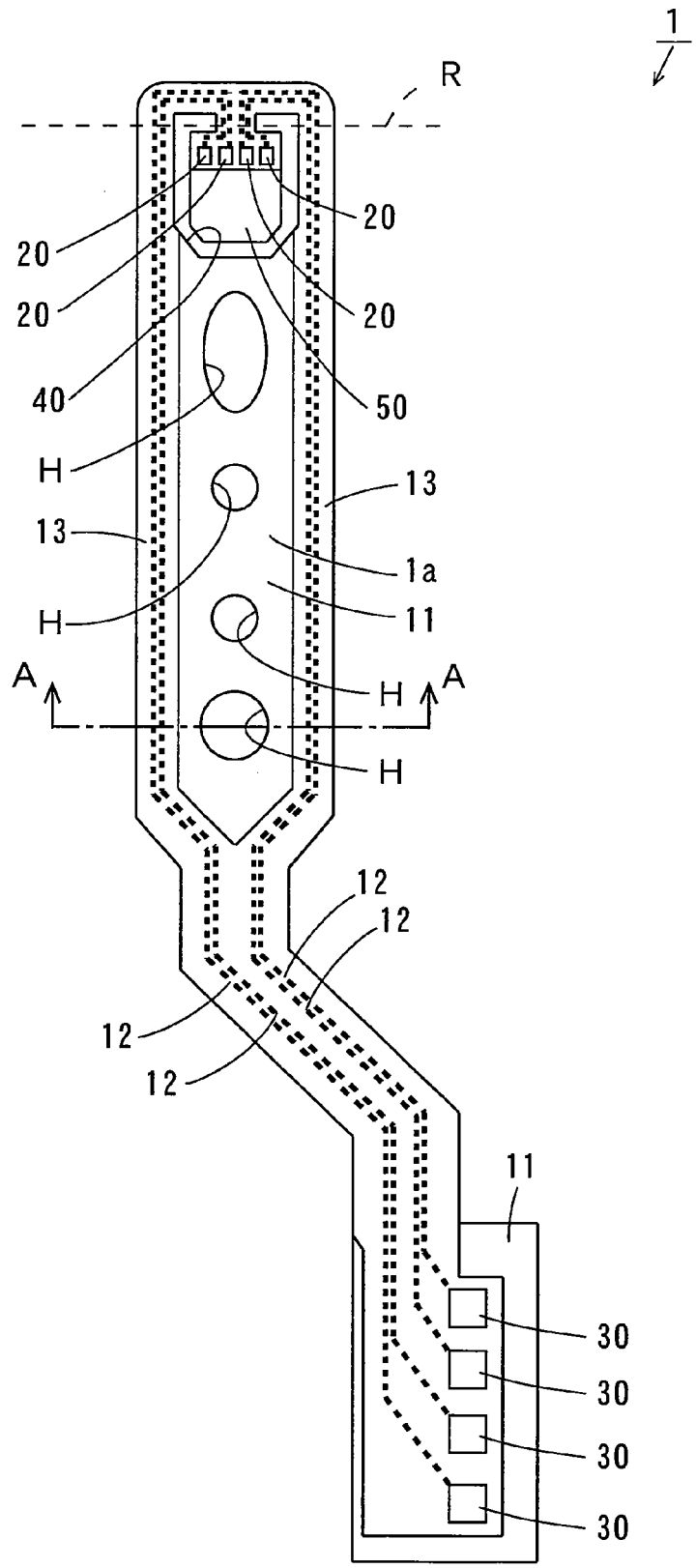
FIG. 3 is a plan view of a suspension board.
Figure 4:
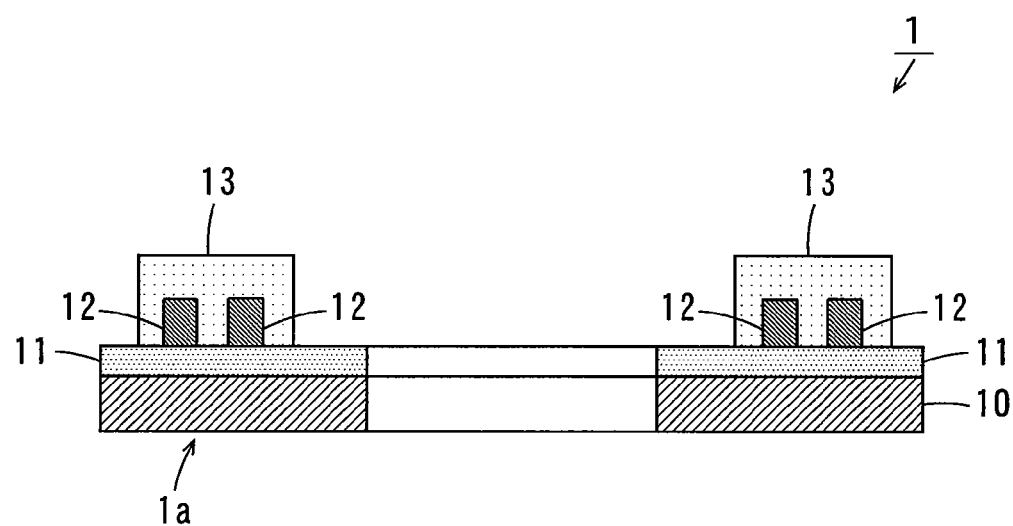
FIG. 4 is a sectional view of the suspension board taken along the line A-A of FIG. 3.

FIG. 3 is a plan view of the suspension board, and FIG. 4 is a sectional view of the suspension board taken along the line A-A of FIG. 3.

As shown in FIG. 3, the suspension board 1 includes a suspension body 1a composed of a support substrate 10 (see FIG. 4) and a base insulating layer 11 described below. At the tip of the suspension body 1a, a U-shaped opening 40 is formed, thereby providing a magnetic head supporting portion (hereinafter referred to as a tongue) 50. The tongue 50 is bent along the broken line R to form a given angle with respect to the suspension body 1a.

Four electrode pads 20 are formed at an end of the tongue 50. Four electrode pads 30 are formed at the other tip of the suspension body 1a. The four electrode pads 20 on the tongue 50 and the four electrode pads 30 at the other tip of the suspension body 1a are electrically connected to one another through a conductor layer 12 in the shape of four lines, which are wiring traces. A plurality of holes H are formed in the suspension body 1a. The conductor layer 12 in the shape of the four lines is covered with a cover insulating layer 13.

As shown in FIG. 4, the base insulating layer 11 made of polyimide is formed on the support substrate 10 made of stainless steel in the cross section taken along the line A-A of FIG. 3. The conductor layer 12 in the shape of four lines made of copper is formed on the base insulating layer 11. The cover insulating layer 13 made of polyimide is formed to cover the conductor layer 12 in the shape of the four lines.

(3) Method of Manufacturing the Suspension Board

Next, description will be made of a method of manufacturing the suspension board 1. FIGS. 5 to 13 are sectional views illustrating steps in one example of the method of manufacturing the suspension board 1 according to the present embodiment. (a) in FIGS. 5 to 13 corresponds to a cross section taken along the line a-a of FIG. 2, and (b) in FIGS. 5 to 13 corresponds to a cross section taken along the line b-b of FIG. 2.

In the example of FIGS. 5 to 13, the first and second photomasks are used for forming the pattern of the conductor layer 12 and the pattern of the cover insulating layer 13, respectively, in the exposure device.

Figure 5:
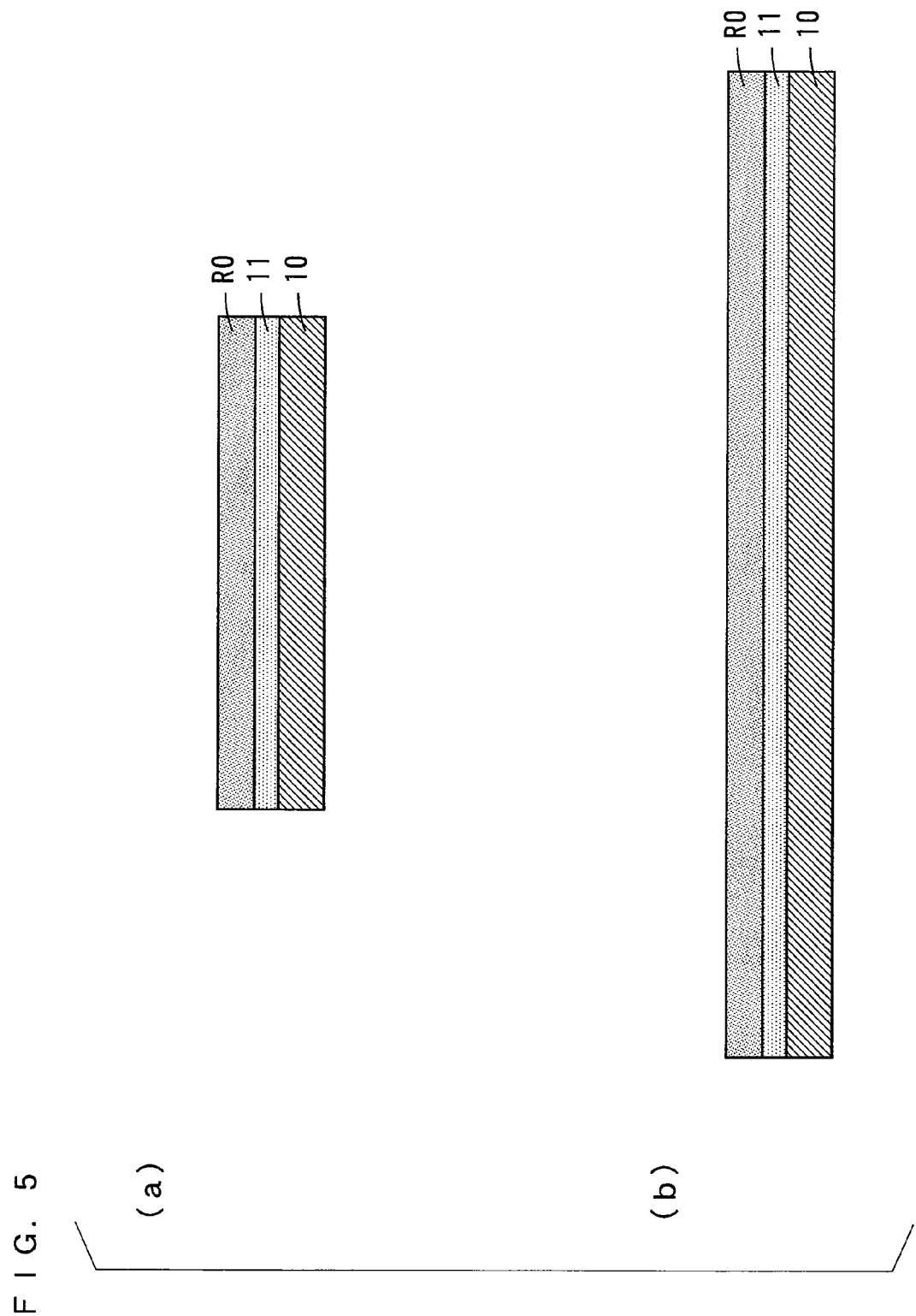
FIGS. 5 (a), (b) are sectional views illustrating a step in one example of a method of manufacturing the suspension board according to the present embodiment.

First, as shown in FIG. 5 (a), the base insulating layer 11 made of polyimide is formed on the long-sized support substrate 10 made of stainless steel. A two-layer base material having a layered configuration of the support substrate 10 and the base insulating layer 11 may be used. A photosensitive resist (hereinafter abbreviated as a resist) is applied on the base insulating layer 11, thereby forming a resist layer R0.

The material for the support substrate 10 is not limited to stainless steel. For example, another metal material such as aluminum (Al) may be used. The thickness of the support substrate 10 is not less than 5 µm and not more than 50 µm, and preferably not less than 10 µm and not more than 30 µm, for example. The material for the base insulating layer 11 is not limited to polyimide. For example, another insulating material such as epoxy may be used. The thickness of the base insulating layer 11 is not less than 3 µm and not more than 20 µm, and preferably not less than 5 µm and not more than 15 µm, for example.

As shown in FIG. 6, a resist pattern RP0 for forming the pattern of the base insulating layer 11 is subsequently formed by subjecting the resist layer R0 to exposure processing and development processing. In the resist pattern RP0, a region excluding a region corresponding to the base insulating layer 11 of the suspension board 1 of FIG. 2 is removed, and a region corresponding to the alignment mark AM is removed.

Figure 7:
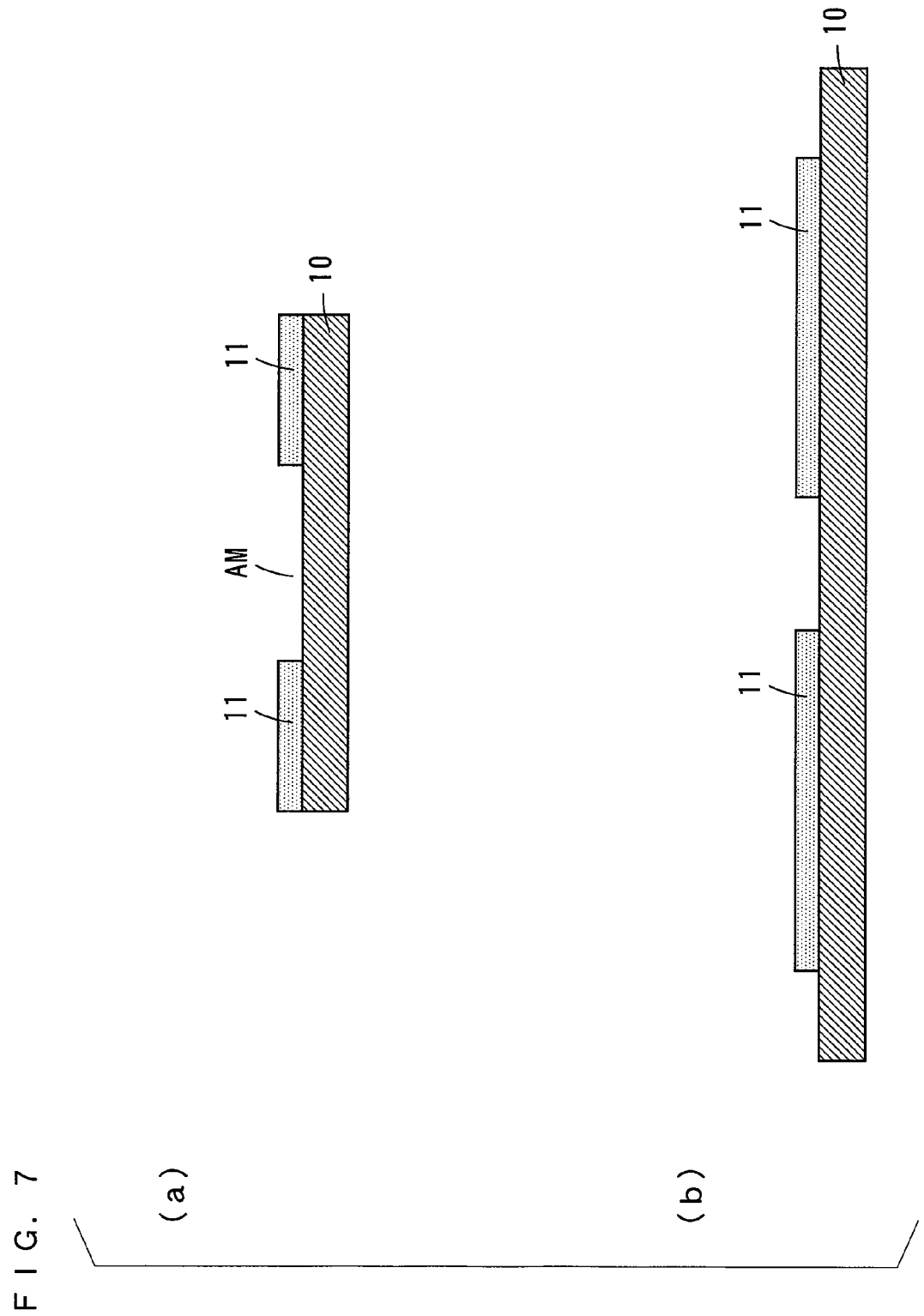
FIGS. 7 (a), (b) are sectional views illustrating a step in the one example of the method of manufacturing the suspension board according to the present embodiment.

After a region of the base insulating layer 11 excluding a region below the resist pattern RP0 is removed by etching, the resist pattern RP0 is removed using a stripping liquid. Thus, the base insulating layer 11 is formed in the given pattern as shown in FIG. 7. The alignment mark AM formed of an opening is formed in the side region ER of the base insulating layer 11 of FIG. 2. FIG. 7 (a) shows the alignment mark AM, and FIG. 7 (b) shows the base insulating layer 11 corresponding to two suspension boards 1.

While the alignment mark AM is formed of the opening in the base insulating layer 11 in this example, the base insulating layer 11 itself may be formed to have the shape of the alignment mark AM.

Then, a resist is applied on the exposed support substrate 10 and the base insulating layer 11, thereby forming a resist layer R1 as shown in FIG. 8.

Next, the resist layer R1 is subjected to exposure processing and development processing, thereby forming a resist pattern RP1 for forming the pattern of the conductor layer 12 as shown in FIG. 9. The first photomask is used in the exposure device during the exposure processing. In this case, the exposure region EX and the first photomask are aligned with each other using the alignment mark AM and the alignment mark of the first photomask.

In the resist pattern RP1, a region 12a corresponding to the conductor layer 12 of the suspension board 1 of FIG. 2 is removed.

Figure 10:
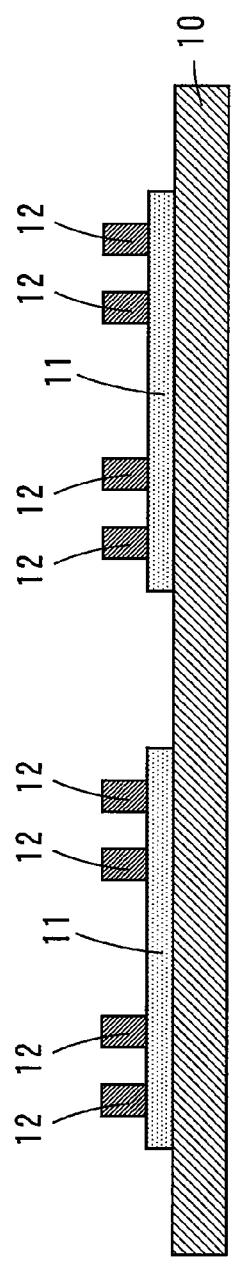
FIGS. 10 (a), (b) are sectional views illustrating a step in the one example of the method of manufacturing the suspension board according to the present embodiment.

In this state, the conductor layer 12 made of copper is formed in the region 12a by electrolytic plating, and the resist pattern RP1 is then removed using a stripping liquid. Accordingly, the conductor layer 12 having the linear pattern is formed on the base insulating layer 11 as shown in FIG. 10. Prior to the electrolytic plating, a plating base, which is not shown, is formed.

The material for the conductor layer 12 is not limited to copper. For example, another metal such as gold (Au) and aluminum or an alloy such as a copper alloy and an aluminum alloy may be used. The thickness of the conductor layer 12 is not less than 3 µm and not more than 16 µm, and preferably not less than 6 µm and not more than 13 µm, for example. The width of the conductor layer 12 is not less than 12 µm and not more than 60 µm, and preferably not less than 16 µm and not more than 50 µm, for example.

The conductor layer 12 may be formed using an additive method or a semi-additive method, or may be formed using another method such as a subtractive method.

After that, the cover insulating layer 13 made of polyimide is formed on the support substrate 10 to cover the conductor layer 12 and the base insulating layer 11 as shown in FIG. 11. Further, a resist is applied on the cover insulating layer 13, thereby forming a resist layer R2.

Then, the resist layer R2 is subjected to exposure processing and development processing, thereby forming a resist pattern RP2 for forming the pattern of the cover insulating layer 13 as shown in FIG. 12. In the resist pattern RP2, a region excluding a region corresponding to the cover insulating layer 13 of the suspension board 1 of FIG. 3 is removed.

The second photomask is used in the exposure device during the exposure processing. In this case, the exposure region EX and the second photomask are aligned with each other using the alignment mark AM and the alignment mark of the second photomask.

Figure 13:
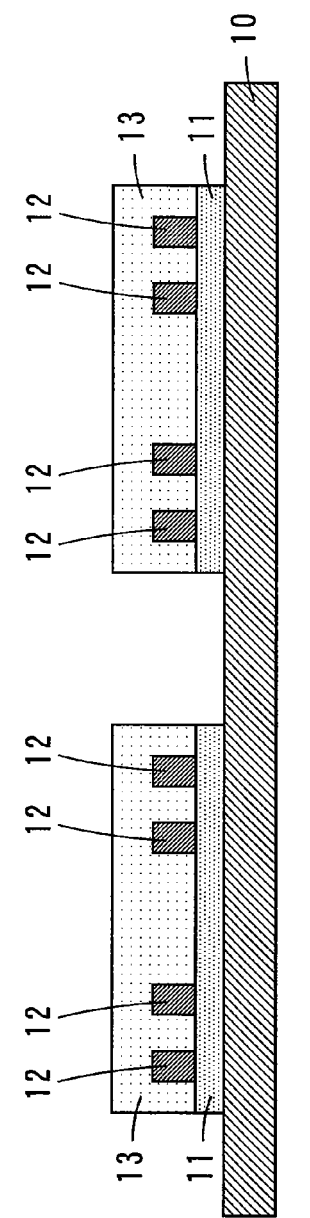
FIGS. 13 (a), (b) are sectional views illustrating a step in the one example of the method of manufacturing the suspension board according to the present embodiment.

After a region of the cover insulating layer 13 excluding a region below the resist pattern RP2 is removed by etching, the resist pattern RP2 is removed using a stripping liquid. Thus, the cover insulating layer 13 is formed in the given pattern as shown in FIG. 13.

The material for the cover insulating layer 13 is not limited to polyimide. For example, another insulating material such as epoxy may be used. The thickness of the cover insulating layer 13 is not less than 5 µm and not more than 30 µm, and preferably not less than 10 µm and not more than 20 µm, for example.

After that, a region of the support substrate 10 excluding a region of the suspension body 1a of FIG. 3 is removed by etching, so that the assembly sheet 100 shown in FIG. 1 is prepared.

Finally, each suspension board 1 is cut off from the frame FR at the coupling portions J of the assembly sheet 100. In this manner, the plurality of suspension boards 1 are completed.

(4) Exposure System

Figure 14:
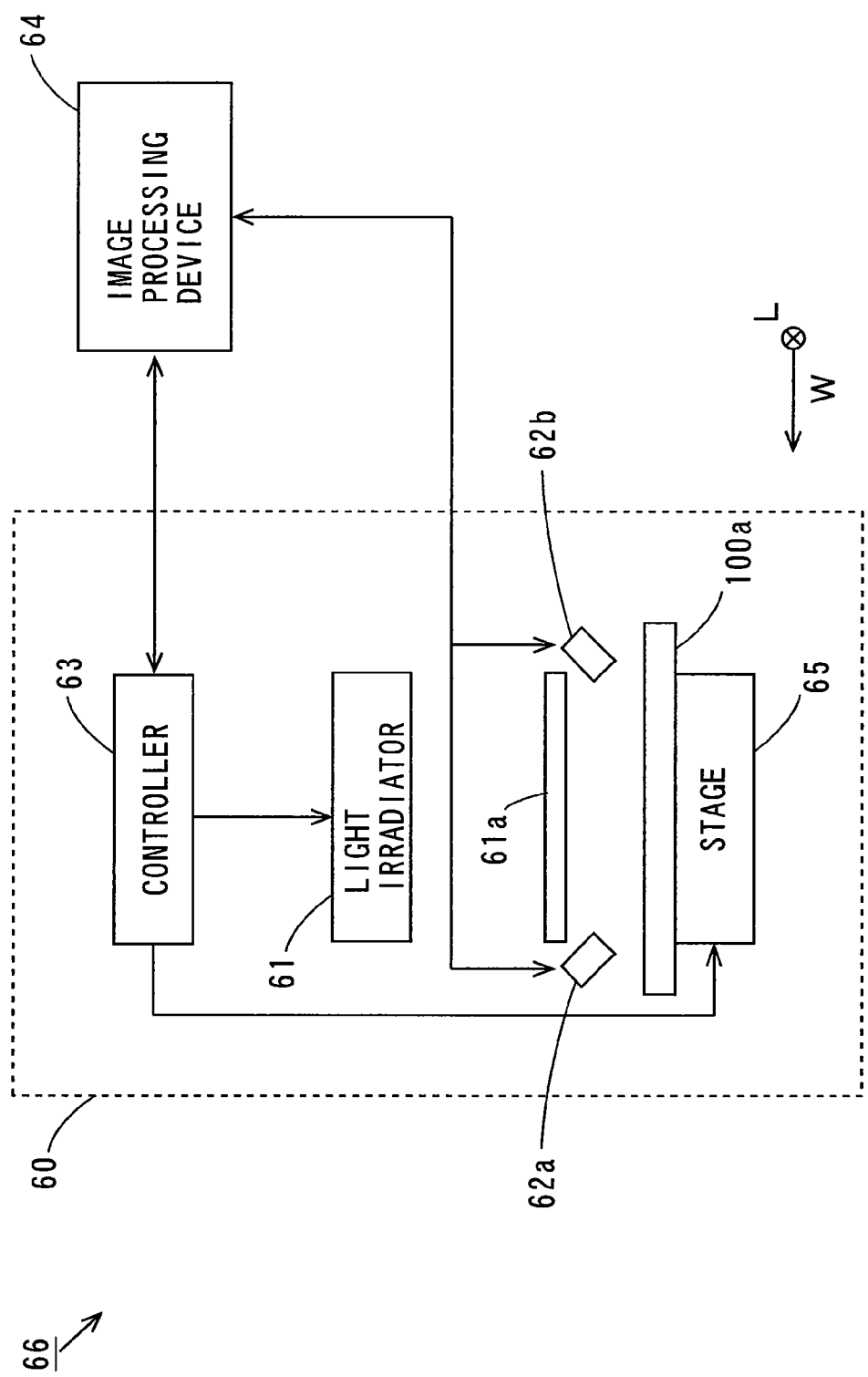
FIG. 14 is a block diagram showing the configuration of an exposure system used in exposure processing.

Next, description will be made of details of the exposure processing in the method of manufacturing the suspension board 1 according to the present embodiment. FIG. 14 is a block diagram showing the configuration of an exposure system used in the exposure processing.

The exposure system 66 of FIG. 14 includes the exposure device 60 and an image processing device 64. The exposure device 60 includes a light irradiator 61, the photomask 61a, a plurality of cameras 62a, 62b, a controller 63 and a stage 65.

The photomask 61a is arranged below the light irradiator 61. The photomask 61a corresponds to any of the foregoing first, second and third photomasks, and is replaced depending on the manufacturing step of the suspension board 1.

The stage 65 is arranged below the photomask 61a. The long-sized base material 100a is arranged on the stage 65 by transport rollers not shown. The stage 65 can move the long-sized base material 100a in the longitudinal direction L and the width direction W (FIG. 1) of the long-sized base material 100a.

The resist layer of the long-sized base material 100a on the stage 65 is irradiated by the light irradiator 61 with light through the photomask 61a. This causes the resist layer of the long-sized base material 100a to be subjected to the exposure processing.

The cameras 62a, 62b are arranged along the width direction W. The camera 62a photographs one side region ER (FIG. 1) of the long-sized base material 100a, and transmits image data to the image processing device 64. The camera 62b photographs the other side region ER (FIG. 1) of the long-sized base material 100a, and transmits image data to the image processing device 64.

The cameras 62a, 62b are configured to be selectively set to a full scan mode and a partial scan mode. The cameras 62a, 62b transmit all the obtained image data in the full scan mode, and extract part of the obtained image data and transmit the partial image data in the partial scan mode.

In this case, the image data transmitted from each of the cameras 62a, 62b in the full scan mode represents an image of the entire region (hereinafter referred to as a full scan region) photographed by each of the cameras 62a, 62b. The image data transmitted from each of the cameras 62a, 62b in the partial scan mode represents an image of part of the region (hereinafter referred to as a partial scan region) photographed by each of the cameras 62a, 62b.

CCD (Charge Coupled Device) cameras are used as the cameras 62a, 62b, for example. The cameras 62a, 62b may be provided in the exposure device 60, or may be provided separately from the exposure device 60.

The controller 63 includes a CPU (Central Processing Unit) and a memory, or includes a microcomputer. The controller 63 controls the light irradiator 61, the cameras 62a, 62b, the image processing device 64 and the stage 65, and acquires data obtained by processing of images from the image processing device 64. The controller 63 may be provided in the exposure device 60, or may be provided separately from the exposure device 60. While the image processing device 64 is provided separately from the controller 63 in the example of FIG. 14, the controller 63 may have the function of the image processing device 64.

The image processing device 64 is composed of a personal computer and image processing software. The image processing device 64 performs image processing, described below, using the image data transmitted from the cameras 62a, 62b, and applies the data obtained through the image processing to the controller 63.

The long-sized base material 100a is a laminate composed of the support substrate 10, the base insulating layer 11 and the resist layer R1 in the step of FIG. 8, and is a laminate composed of the support substrate 10, the base insulating layer 11, the conductor layer 12, the cover insulating layer 13 and the resist layer R2 in the step of FIG. 11.

In the present embodiment, the image processing device 64 paratactically performs processing using the image data transmitted from the camera 62a and processing using the image data transmitted from the camera 62b by multithread processing.

(5) Operations of the Exposure System

Figure 15:
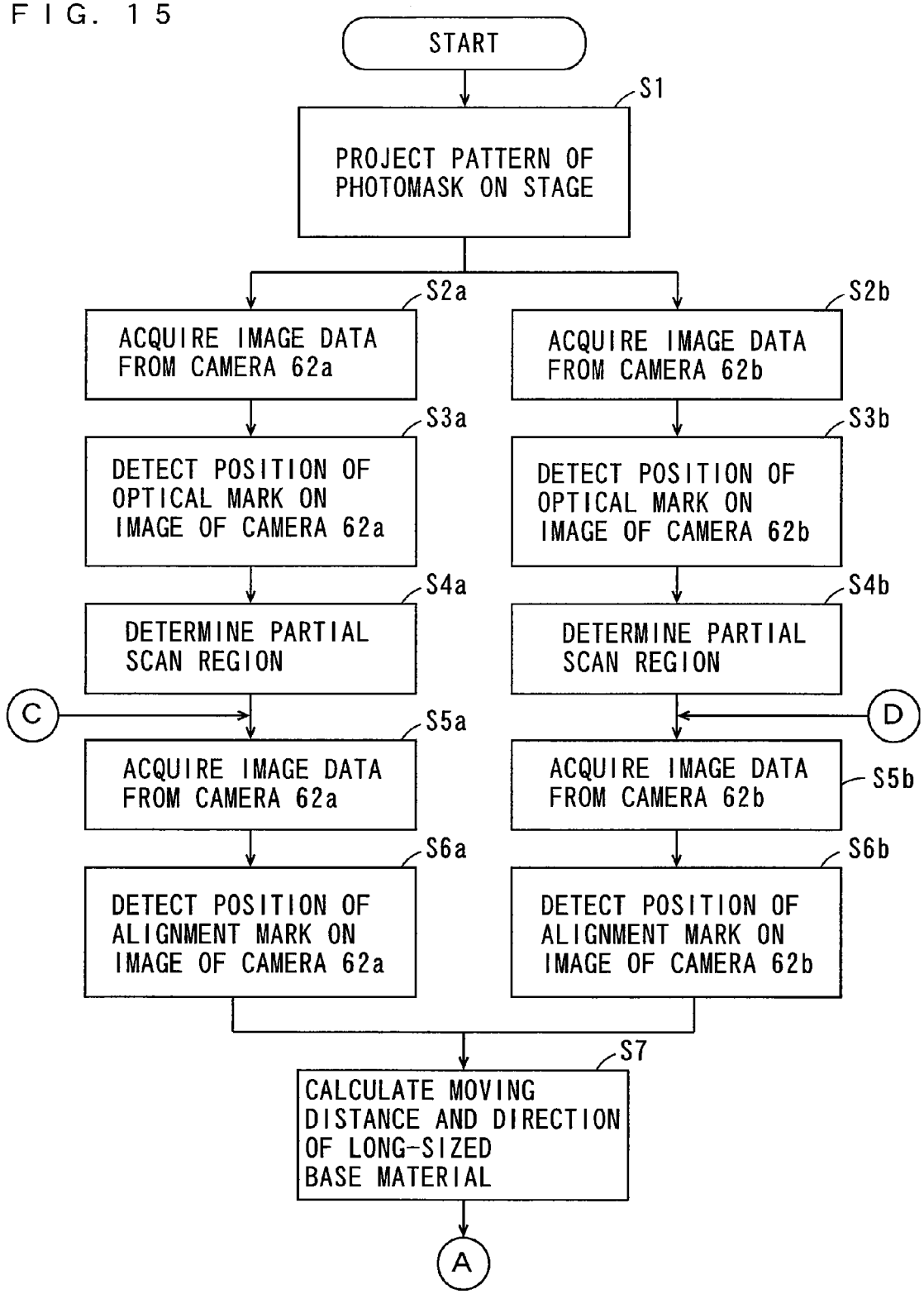
FIG. 15 is a flowchart showing operations of the exposure system of FIG. 14.
Figure 16:
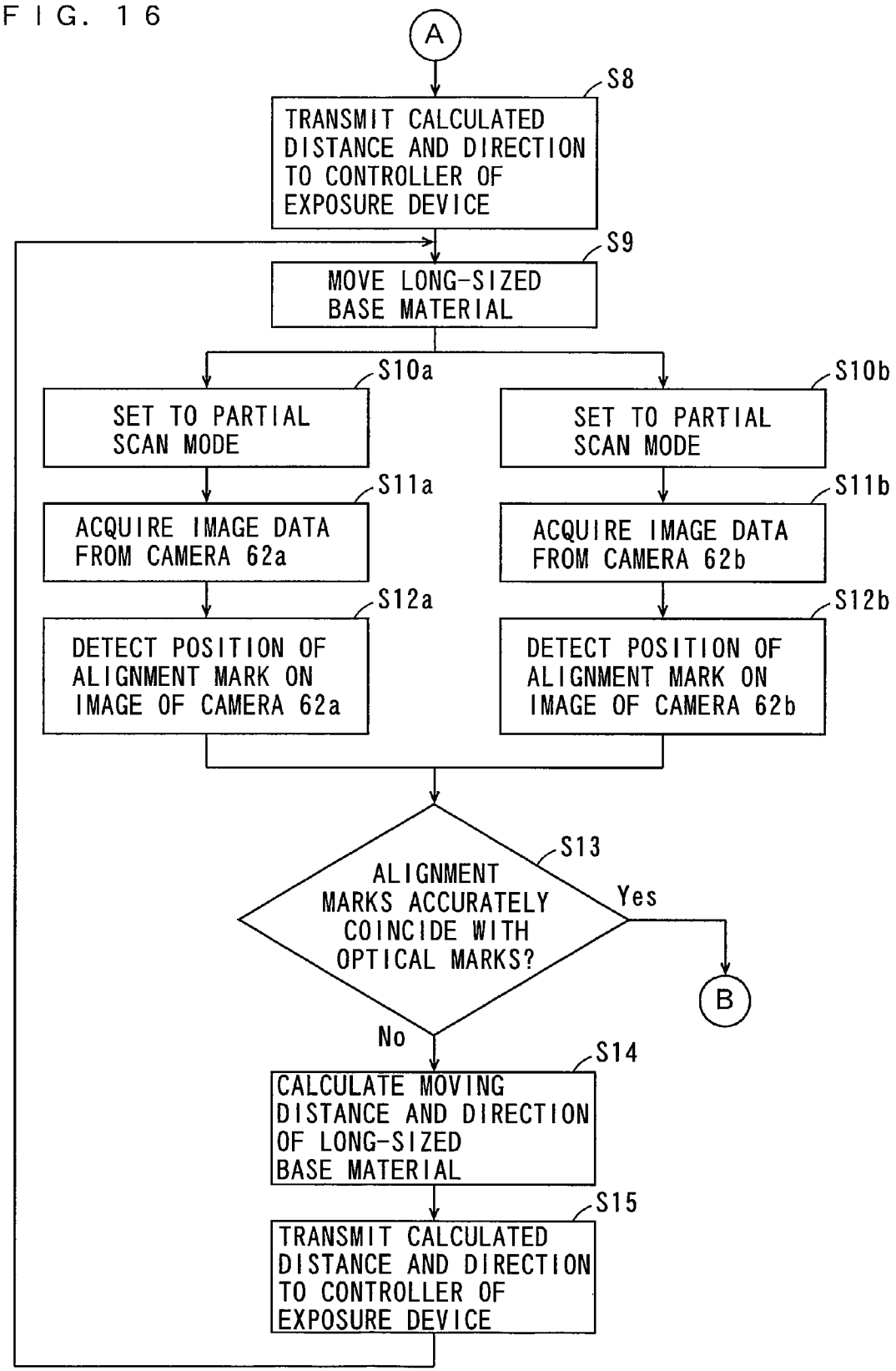
FIG. 16 is a flowchart showing operations of the exposure system of FIG. 14.
Figure 17:
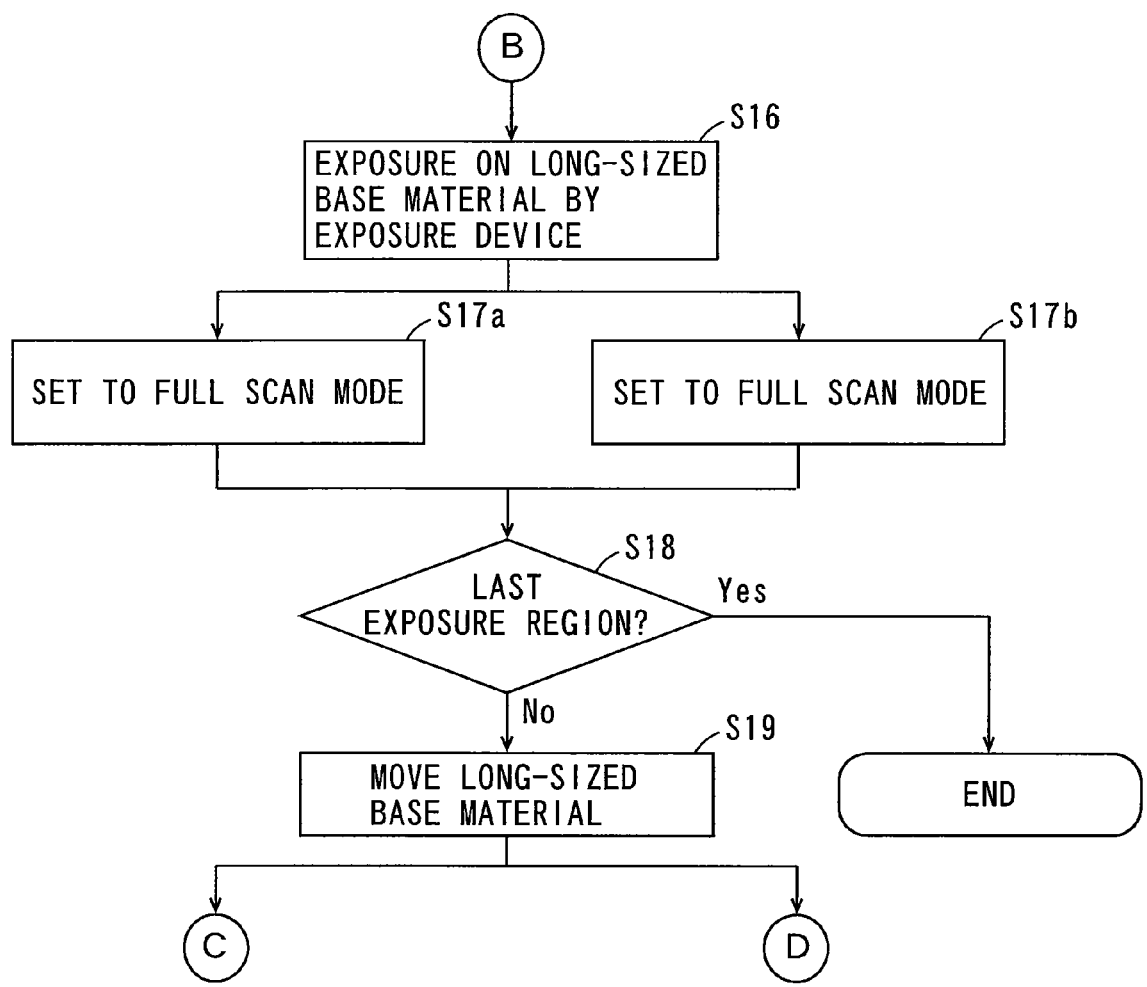
FIG. 17 is a flowchart showing operations of the exposure system of FIG. 14.
Figure 18:
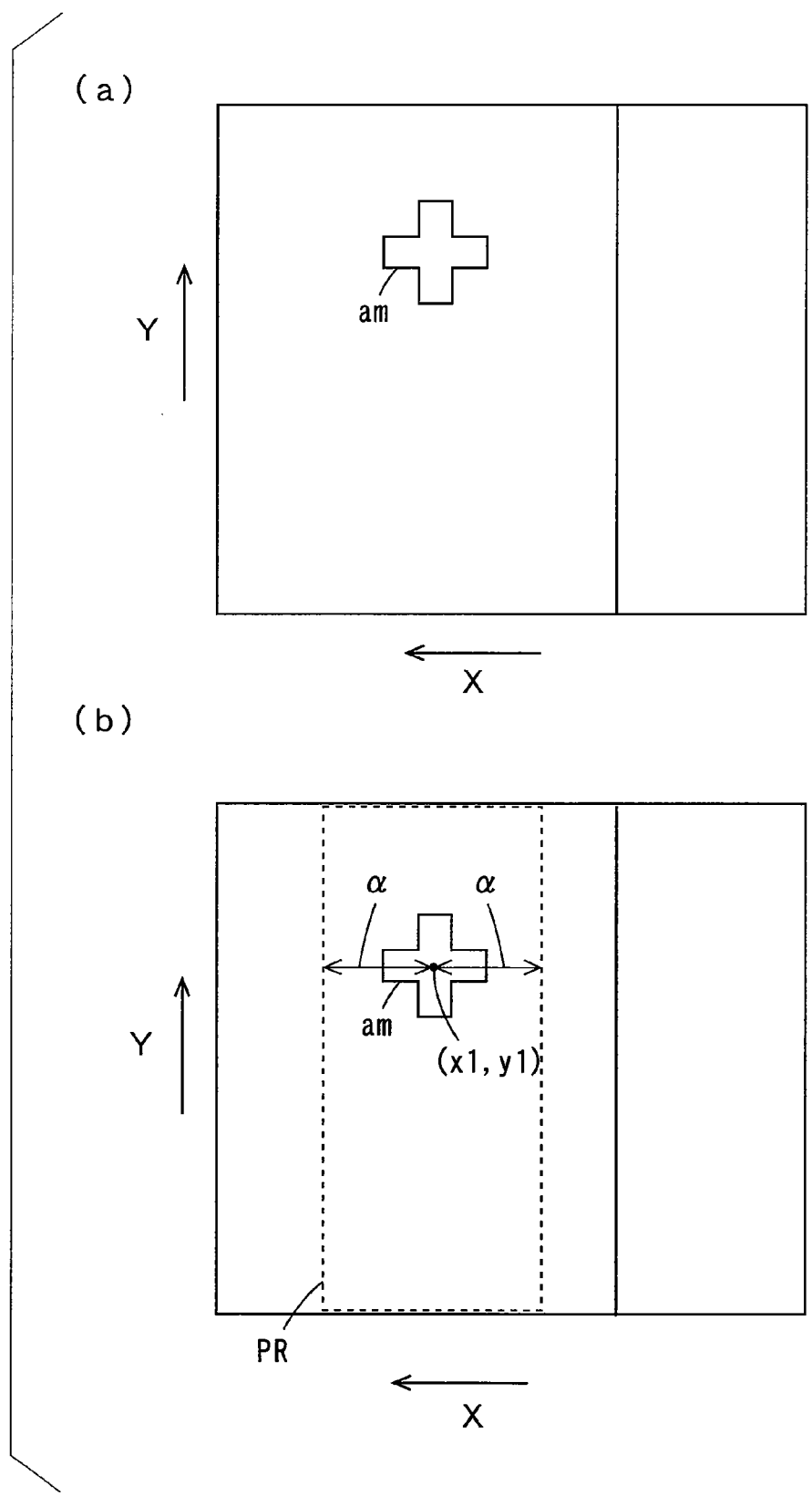
FIGS. 18 (a), (b) are diagrams showing examples of images obtained by cameras.

Next, description will be made of operations of the exposure system 66 of FIG. 14. FIGS. 15 to 17 are flowcharts showing the operations of the exposure system 66 of FIG. 14. FIGS. 18 and 19 are schematic diagrams of the images represented by the image data from the cameras 62a, 62b. Here, the exposure processing of FIGS. 8 and 9 is shown as an example.

In the following description, one direction (a transverse direction) is referred to as an X-direction, and another direction that is perpendicular to the foregoing one direction (a longitudinal direction) is referred to as a Y-direction on the images represented by the image data from the cameras 62a, 62b. The coordinate in the X-direction on the image is referred to as the X-coordinate, and the coordinate in the Y-direction on the image is referred to as the Y-coordinate. The X-direction on the image corresponds to the width direction W of the long-sized base material 100a, and the Y-direction on the image corresponds to the longitudinal direction L of the long-sized base material 100a.

First, the controller 63 of the exposure device 60 controls the light irradiator 61 to project the pattern of the photomask 61a (the first photomask) on the stage 65 with the long-sized base material 100a not arranged on the stage 65 (Step S1).

Next, the image processing device 64 causes the camera 62a to photograph a region on the stage 65, and acquires image data transmitted from the camera 62a (Step S2a). At the same time, the image processing device 64 causes the camera 62b to photograph a region on the stage 65, and acquires image data transmitted from the camera 62b (Step S2b). The image data transmitted from the cameras 62a, 62b in Steps S2a, S2b are examples of first image data.

In this case, the camera 62a photographs the region of the stage 65 on which the one side region ER of the long-sized base material 100a is to be arranged. The camera 62b photographs the region of the stage 65 on which the other side region ER of the long-sized base material 100a is to be arranged. Optical marks are formed by light passing through a cross-shaped opening that is the alignment mark of the photomask 61a on the regions of the stage 65 photographed by the cameras 62a, 62b.

FIG. 18 (a) shows one example of the images represented by the image data acquired in Steps S2a, S2b. The image shown in FIG. 18 (a) includes the optical mark am formed by the light passing through the cross-shaped opening that is the alignment mark of the photomask 61a. The image of FIG. 18 (a) is an example of the first image.

In an initial state, each of the cameras 62a, 62b is set to the full scan mode. Therefore, the image data transmitted from the cameras 62a, 62b in Steps S2a, S2b represent the images of the full scan region.

Hereinafter, the image represented by the image data acquired from the camera 62a is referred to as the image of the camera 62a, and the image represented by the image data acquired from the camera 62b is referred to as the image of the camera 62b.

Next, the image processing device 64 detects a position of the optical mark by pattern matching on the image of the camera 62a (Step S3a), and detects a position of the optical mark by pattern matching on the image of the camera 62b (Step S3b).

The image processing device 64 then determines the partial scan region of the camera 62a based on the position of the optical mark detected in Step S3a (Step S4a), and determines the partial scan region of the camera 62b based on the position of the optical mark detected in Step S3b (Step S4b).

For example, the image processing device 64 calculates the coordinates at the center of the optical mark on each of the images of the cameras 62a, 62b. A photographing region of each of the cameras 62a, 62b corresponding to a region of a constant width including the calculated coordinates is determined as the partial scan region of each of the cameras 62a, 62b.

In the example of FIG. 18 (b), the coordinates (x1, y1) at the center of the optical mark am are calculated. Here, "x1" is the X-coordinate, and "y1" is the Y-coordinate. In this case, the photographing region corresponding to a region PR whose X-coordinate is not less than "x1−α" and not more than "x1+α" is determined as the partial scan region.

Then, the light irradiator 61 is turned off, and the long-sized base material 100a is transported onto the stage 65 by the transport rollers not shown. In the state, the image processing device 64 causes the camera 62a to photograph the one side region ER of the long-sized base material 100a, and acquires image data transmitted from the camera 62a (Step S5a). At the same time, the image processing device 64 causes the camera 62b to photograph the other side region ER of the long-sized base material 100a on the stage 65, and acquires the image data transmitted from the camera 62b (Step S5b). The image data transmitted from the cameras 62a, 62b in Steps S5a, S5b are examples of second image data.

FIG. 19 (a) shows one example of the images represented by the image data acquired in Steps S5a, S5b. The image of FIG. 19 (a) includes the alignment mark AM of the long-sized base material 100a. The image of FIG. 19 (a) is an example of the second image.

Next, the image processing device 64 detects the position of the alignment mark AM by pattern matching on the image of the camera 62a (Step S6a), and detects the position of the alignment mark AM by pattern matching on the image of the camera 62b (Step S6b).

The image processing device 64 subsequently calculates a direction in which and a distance by which the long-sized base material 100a is to be moved based on the positions of the optical marks detected in Steps S3a, S3b and the positions of the alignment marks AM detected in Steps S6a, S6b such that these positions coincide with one another (Step S7).

Then, the image processing device 64 transmits the calculated direction and distance to the controller 63 of the exposure device 60 as shown in FIG. 16 (Step S8). The controller 63 controls the stage 65 to move the long-sized base material 100a based on the transmitted direction and distance (Step S9).

The image processing device 64 subsequently sets each of the cameras 62a, 62b to the partial scan mode (Steps S10a, S10b). The image processing device 64 sets the partial scan region determined in Step S4a in the camera 62a, and sets the partial scan region determined in Step S4b in the camera 62b. In this case, the image data of the partial scan region determined in Step S4a is transmitted from the camera 62a, and the image data of the partial scan region determined in Step S4b is transmitted from the camera 62b.

Next, the image processing device 64 causes the camera 62a to photograph the one side region ER of the long-sized base material 100a that has been moved, and acquires image data transmitted from the camera 62a (Step S11a). At the same time, the image processing device 64 causes the camera 62b to photograph the other side region ER of the long-sized base material 100a that has been moved, and acquires image data transmitted from the camera 62b (Step S11b). In this case, the image processing device 64 acquires the image data of the partial scan regions. The image data transmitted from the cameras 62a, 62b in Steps S11a, S11b are examples of third image data.

FIG. 19 (b) shows one example of the images represented by the image data acquired in Steps S10a, S10b. In this case, since the long-sized base material 100a is moved in Step S8, the alignment mark AM appears at substantially the same position as the position of the optical mark am detected in Steps S3a, S3b. The image of FIG. 19 (b) is an example of the third image.

Next, the image processing device 64 detects the position of the alignment mark AM by pattern matching on the image acquired from the camera 62a (Step S12a), and detects the position of the alignment mark AM by pattern matching on the image acquired from the camera 62b (Step S12b).

In this case, since the image of the partial scan region is smaller than the image of the full scan region, detection with high accuracy can be performed in a shorter time on the image of the partial scan region.

In Steps S12a, S12b, the image processing device 64 may precisely detect the shape, dimensions and so on of the alignment mark AM, and determine whether or not the detected shape and dimensions correspond to the previously stored shape and dimensions of the alignment mark AM. This provides confirmation as to whether there is any erroneous recognition of another mark formed in the long-sized base material 100a or dust or the like adhering to the long-sized base material 100 as the alignment mark AM. When the detected shape and dimensions do not coincide with the previously stored shape and dimensions of the alignment mark AM, the image processing device 64 returns to the processes of Steps S5a, S5b, for example.

Then, the image processing device 64 determines whether or not the positions of the alignment marks AM detected in Steps S12a, S12b accurately coincide with the positions of the optical marks detected in Steps S3a, S3b, respectively (Step S13).

When the position of at least one alignment mark AM does not accurately coincide with the position of the optical mark, the image processing device 64 calculates the distance by which and the direction in which the long-sized base material 100a is to be moved based on the positions of the alignment marks AM detected in Steps S12a, S12b such that the position of each alignment mark AM accurately coincides with the position of each optical mark, similarly to the processing of Step S7 (Step S14). Then, the image processing device 64 transmits the calculated distance and direction to the controller 63 of the exposure device 60 (Step S15), and returns to the process of Step S9.

When the position of each alignment mark AM accurately coincides with the position of each optical mark, the image processing device 64 instructs the controller 63 of the exposure device 60 to perform exposure on the long-sized base material 100a as shown in FIG. 17 (Step S16).

The controller 63 controls the light irradiator 62 to perform exposure on the exposure region EX of the long-sized base material 100a. After that, the image processing device 64 sets the camera 62a to the full scan mode (Step S17a), and sets the camera 62b to the full scan mode (Step S17b).

The controller 63 determines whether or not the exposure that is just finished is the exposure on the last exposure region EX of the long-sized base material 100a (Step S18). When the exposure that is just finished is not the exposure on the last exposure region EX of the long-sized base material 100a, the controller 63 causes the transport rollers not shown to move the long-sized base material 100a such that the subsequent exposure region EX of the long-sized base material 100a is positioned below the light irradiator 61 (Step S19). After that, the controller 63 instructs the image processing device 64 to return to the processing of Steps S5a, S5b. When the exposure that is just finished is the exposure on the last exposure region EX of the long-sized base material 100a, the controller 63 finishes the exposure processing.

(6) Effects

In the present embodiment, the processing using the image data from the camera 62a and the processing using the image data from the camera 62b are paratactically performed. Thus, the positional relationships between the plurality of alignment marks (optical marks) of the photomask and the plurality of alignment marks AM of the long-sized base material 100a can be obtained in a shorter time.

In the present embodiment, after the optical marks are aligned with the alignment marks AM, respectively, based on the image data in the full scan mode, determination as to whether or not the positions of the optical marks accurately coincide with the position of the alignment mark AM, respectively, is made based on the image data in the partial scan mode. In this case, the amount of the image data in the partial scan mode is smaller than the amount of the image data in the full scan mode. Therefore, the image data in the partial scan mode are transmitted from the cameras 62a, 62b to the image processing device 64 in a shorter time than the image data in the full scan mode. Accordingly, the image data in the partial scan mode are used, thereby further reducing processing time.

Since the amount of the image data in the partial scan mode is comparatively small, processing capability of the image processing device 64 allows the parallel processing using the image data in the partial san mode to be reliably performed in a shorter time. Accordingly, the positional relationships between the plurality of optical marks and the plurality of alignment marks AM can be simultaneously obtained in a shorter time.

Accordingly, time for aligning the photomask 61a with the exposure region EX of the long-sized base material 100a can be sufficiently reduced. As a result, manufacture efficiency of the printed circuit board (suspension board 1) can be improved.

(7) Other Embodiments

While the two cameras 62a, 62b are provided in the exposure device 61 in the foregoing embodiment, the number of cameras is not limited to two. For example, three or more cameras may be provided. In this case, processing using image data transmitted from three or more cameras may be paratactically performed by the image processing device 62.

While the cameras 62a, 62b are arranged above the long-sized base material 100a and upper surfaces of the side regions ER are photographed by the cameras 62a, 62b in the foregoing embodiment, the cameras 62a, 62b may be arranged below the long-sized base material 100a and lower surfaces of the side regions ER may be photographed by the cameras 62a, 62b. In this case, the alignment mark AM is formed so as to be visually recognized from below the long-sized base material 100a.

While the photomask is fixed and the long-sized base material 100a is moved by the stage 65 at the time of aligning the photomask with the long-sized base material 100a in the foregoing embodiment, the present invention is not limited to this. For example, the long-sized base material 100a may be fixed and the photomask may be moved. Alternatively, both the long-sized base material 100a and the photomask may be moved.

While the image data representing the image including the optical mark and the image data representing the image including the alignment mark AM of the long-sized base material 100a are separately transmitted from each of the cameras 62a, 62b to the image processing device 64 in the foregoing embodiment, the image data representing a synthetic image of these images may be transmitted to the image processing device 64. In this case, the synthetic image includes both the optical mark and the alignment mark AM of the long-sized base material 100a.

While the two alignment marks AM are formed corresponding to each substrate formation region SR of the assembly sheet 100 in the foregoing embodiment, the number of alignment marks AM is not limited to two. One alignment mark AM may be formed, and three or more alignment marks AM may be formed corresponding to each substrate formation region SR. The shape of the alignment mark AM is not limited to the cross shape. For example, the alignment mark AM may have any shape such as a round shape, a triangular shape or a quadrangular shape.

While the alignment mark AM is formed in the base insulating layer 11 in the foregoing embodiment, the present invention is not limited to this. The alignment mark AM may be formed in another layer. For example, the alignment mark AM may be formed by a method such as punching in the support substrate 10.

While the method of manufacturing the suspension board is described as an example of the method of manufacturing the printed circuit board in the foregoing embodiment, the method of manufacturing the printed circuit board according to the present invention is also applicable to methods of manufacturing various printed circuit boards such as a flexible printed circuit board, a substrate for COF (Chip On Film) and a substrate for TAB (Tape Automated Bonding), not limited to the suspension board.

(8) Correspondences Between Elements in the Claims and Parts in Embodiments

In the following paragraphs, non-limiting examples of correspondences between various elements recited in the claims below and those described above with respect to various preferred embodiments of the present invention are explained.

In the foregoing embodiments, the long-sized base material 100a is an example of a base material, the photomask 61a is an example of a photomask, the optical mark am is an example of a first alignment mark, the alignment mark AM is an example of a second alignment mark, the cameras 62a, 62b are examples of an imaging device, and the image processing device 64 is an example of a data processing device.

The exposure device 60 is an example of an exposure device, the suspension board 1 is an example of a printed circuit board, the base insulating layer 11 is an example of a first insulating layer, the conductor layer 12 is an example of a conductor layer, the cover insulating layer 13 is an example of a second insulating layer, and the resist layers R1, R2 are examples of a photosensitive resist layer.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A method of aligning a photomask with a base material when exposure processing is performed on said base material, wherein said photomask has a plurality of first alignment marks, and said base material has a plurality of second alignment marks corresponding to said plurality of first alignment marks, and said method comprising the steps of:

acquiring a plurality of first images including said plurality of first alignment marks, respectively, by a plurality of imaging devices;

transmitting a plurality of first image data representing said plurality of first images, respectively, from said plurality of imaging devices to a data processing device;

detecting positions of said first alignment marks by said data processing device based on said plurality of first image data and setting respective partial regions including said first alignment marks in imaging ranges of said plurality of imaging devices;

acquiring a plurality of second images including said plurality of second alignment marks, respectively, by said plurality of imaging devices;

transmitting a plurality of second image data representing said plurality of second images, respectively, from said plurality of imaging devices to the data processing device;

calculating respective positional relationships between said plurality of first alignment marks and said plurality of second alignment marks by paratactic data processing of said data processing device based on said plurality of second image data;

moving said base material relative to said photomask based on the positional relationships calculated by said data processing device such that the positions of said plurality of first alignment marks coincide with positions of said plurality of second alignment marks, respectively;

acquiring a plurality of third images including said plurality of second alignment marks, respectively, by said plurality of imaging devices after said base material is moved relative to said photomask;

transmitting respective image data of said set partial regions in said plurality of third images as a plurality of third image data from said plurality of imaging devices to said data processing device;

calculating the respective positional relationships between said plurality of first alignment marks and said plurality of second alignment marks by the paratactic data processing of said data processing device based on said plurality of third image data; and determining whether or not the positions of said plurality of first alignment marks coincide with the positions of said plurality of second alignment marks, respectively, based on the positional relationships obtained by said data processing device.

2. The method of aligning the photomask with the base material according to claim 1, wherein accuracy of the calculation of said positional relationships based on said plurality of third image data is higher than accuracy of the calculation of said positional relationships based on said plurality of second image data.

3. The method of aligning the photomask with the base material according to claim 1, wherein said paratactic data processing is multithread processing.

4. A method of manufacturing a printed circuit board including exposure processing for forming a pattern of any layer of a base material including a plurality of layers, comprising the steps of:

forming a plurality of second alignment marks, which correspond to a plurality of first alignment marks formed in a photomask in an exposure device, in said base material; and performing the exposure processing on the any layer of said base material, wherein the step of performing the exposure processing includes the steps of:

acquiring a plurality of first images including said plurality of first alignment marks, respectively, by a plurality of imaging devices;

transmitting a plurality of first image data representing said plurality of first images, respectively, from said plurality of imaging devices to a data processing device;

detecting positions of said first alignment marks by said data processing device based on said plurality of first image data and setting respective partial regions including said first alignment marks in imaging ranges of said plurality of imaging devices;

acquiring a plurality of second images including said plurality of second alignment marks, respectively, by said plurality of imaging devices;

transmitting a plurality of second image data representing said plurality of second images, respectively, from said plurality of imaging devices to the data processing device;

calculating respective positional relationships between said plurality of first alignment marks and said plurality of second alignment marks by paratactic data processing of said data processing device based on said plurality of second image data;

moving said base material relative to said photomask based on the positional relationships calculated by said data processing device such that the positions of said plurality of first alignment marks coincide with positions of said plurality of second alignment marks, respectively;

acquiring a plurality of third images including said plurality of second alignment marks, respectively, by said plurality of imaging devices after said base material is moved relative to said photomask;

transmitting respective image data of said set partial regions in said plurality of third images as a plurality of third image data from said plurality of imaging devices to said data processing device;

calculating the respective positional relationships between said plurality of first alignment marks and said plurality of second alignment marks by the paratactic data processing of said data processing device based on said plurality of third image data;

determining whether or not the positions of said plurality of first alignment marks coincide with the positions of said plurality of second alignment marks, respectively, based on the positional relationships obtained by said data processing device; and performing exposure on said base material by said exposure device using said photomask when the positions of said plurality of first alignment marks coincide with the positions of said plurality of second alignment marks, respectively.

5. The method of manufacturing the printed circuit board according to claim 4, wherein said printed circuit board includes a first insulating layer, a conductor layer and a second insulating layer in this order, and said base material includes at least a photosensitive resist layer, and said exposure processing is performed on said photosensitive resist layer for forming a pattern of at least one of said first insulating layer, said conductor layer and said second insulating layer.

* * * * *